United States Patent [19]

Leupold

[11] Patent Number: 4,839,059

[45] Date of Patent: Jun. 13, 1989

[54] CLAD MAGIC RING WIGGLERS

[75] Inventor: Herbert A. Leupold, Eatontown, N.J.

[73] Assignee: The United States of America as represented by the Secretary of the Army, Washington, D.C.

[21] Appl. No.: 210,687

[22] Filed: Jun. 23, 1988

[51] Int. Cl.4 ............................................. H01F 7/00
[52] U.S. Cl. .................................. 210/335; 335/301; 335/304
[58] Field of Search ............... 335/301, 302, 303, 304, 335/306

[56] References Cited

U.S. PATENT DOCUMENTS

| 3,768,054 | 10/1973 | Neugebauer | 335/306 X |
| 4,614,930 | 9/1986 | Hickey et al. | 335/306 X |
| 4,720,692 | 1/1988 | Jin | 335/306 X |
| 4,731,598 | 3/1988 | Clarke | 335/210 |

OTHER PUBLICATIONS

"Proceedings of the Eighth International Workshop on Rare Cobalt Permanent Magnets", by Klaus Halbach, (Univ. Dayton, Dayton, Ohio, 1985), pp. 123-136.

Primary Examiner—George Harris
Attorney, Agent, or Firm—Sheldon Kanars; John T. Rehberg

[57] ABSTRACT

A linear array of clad truncated magic ring segments. Each segment has an entrance and exit hole in its respective cladding magnets. The individual segments are arranged to provide a periodic permanent magnet structure suitable for use in a wiggler or a twister.

12 Claims, 4 Drawing Sheets

CLAD MAGIC RING WIGGLERS

The invention described herein may be manufactured, used, and licensed by or for the Government for governmental purposes without the payment of any royalties thereon.

TECHNICAL FIELD

The present invention relates in general to permanent magnet structures for use in electronic devices and, more particularly, to periodic permanent magnetic structures capable of producing magnetic fields greater than the remanence of the magnetic material comprising them.

BACKGROUND OF THE INVENTION

Many devices that employ magnetic fields have heretofore been encumbered by massive solenoids with their equally bulky power supplies. Thus, there has been increasing interest in the application of permanent magnet structures for such uses as electron-beam focusing and biasing fields. The current demand for compact, strong, static magnetic field sources that require no electric power supplies has created needs for permanent magnet structures of unusual form. A number of configurations have been designed and developed for electron beam guidance in millimeterwave microwave tubes of various types; for dc biasing fields in millimeter wave filters, circulators, isolators, striplines; for field sources in NMR (nuclear magnetic resonance) imagers; and so on. Especially promising for such purposes is the configuration based upon the hollow cylindrical flux source (HCFS) principle described by K. Halbach in "Proceedings of the Eighth International Workshop on Rare Earth Cobalt Permanent Magnets", Univ. of Dayton, Dayton, Oh., 1985 (pp. 123-136). A HCFS, sometimes called a "magic ring", is a cylindrical permanent magnet shell which produces an internal magnetic field that is more or less constant in magnitude. The field is perpendicular to the axis of the cylinder, and furthermore the field strength can be greater than the remanence of the magnetic material from which the ring is made.

The ideal magic ring is an infinitely long, annular cylindrical shell which produces an intense magnetic field in its interior working space. The direction of the magnetic field in the working space interior is perpendicular to the long axis of the cylinder. The aforementioned Halback publication discloses a structure with an octagonal cross section which closely approximates the performance and field configuration of an ideal magic ring (which has a circular cross section). In both the ideal and Halbach configurations, no magnetic flux extends to the exterior of the ring structure (except at the ends of a finite cylinder).

The term "magic ring" as used herein encompasses not only the ideal cylindrical structure but also octagonal, sixteen sided, thirty-two sided and even higher order polygonal-sided structures which approximate the ideal magic ring.

Unfortunately, the magic ring is theoretically infinitely long. Thus, achievement of the desirable high uniform magnetic fields in the interior of the magic ring structure demands that the structure be made extremely long (theoretically infinite). If the structure is not long enough, distortion of the interior fields will result.

Those concerned with the development of high power microwave devices such as wigglers and twisters have continually searched for means to create intense magnetic fields in confined spaces with lightweight devices.

A wiggler is a high power (megawatt) radiation source. In wiggler operation, an electron beam is injected into a drift region which is surrounded by a periodic permanent magnet source. The periodic permanent magnet source creates a magnetic field which changes directions (by 180°) at fixed intervals, yet is always perpendicular to the principal direction of electron beam travel. (By contrast, and an twister is an electron beam device in which the magnetic field orientation changes more gradually).

The advent of magnetically "hard" materials, i.e. magnetic materials which maintain their full magnetization against fields larger than their coercivities, permits the fabrication of many novel magnetic structures. Examples of magnetically "hard" materials are: neodymium iron boride ($Nd_2Fe_{14}B$), samarium cobalt ($SmCo_5$), platinum cobalt, ($PtCo_5$), and a samarium cobalt alloy, ($Sm_2(CoT)_{17}$, where T represents one or more transition metals) together with selected ferrites. These materials may be pressed or fabricated into various desired shapes and magnetized in a variety of desired orientations using techniques known to those skilled in the art.

SUMMARY OF THE INVENTION

It is therefore an object of this invention to provide a periodic permanent magnet structure with compact external dimensions and high interior magnetic flux.

It is another object of this invention to provide a permanent magnet construction having an improved magnetic intensity per unit weight ratio.

It is a further object of this invention to provide a periodic permanent magnet structure with minimal external flux leakage.

It is additionally an object of this invention to provide a periodic permanent magnetic structure which produces a periodic magnetic field having a field strength comparable to that of the remanence of the magnetic material comprising the structure.

The above and other objects are achieved in accordance with the present invention. A plurality of truncated magic ring structures are arranged in linear fashion so that their interior working space fields are 180° apart. Secondary cladding magnets are added to each of the truncated magic rings. The aforementioned cladding magnets are uniquely shaped so that their exterior surfaces are at a constant magnetic potential, thus preventing flux leakage from the ends of the truncated structures and intensifying the magnetic fields interior to the aforementioned structures. Small holes are placed in each of the secondary cladding magnets to permit an electron beam to traverse the entire structure.

BRIEF DESCRIPTION OF THE DRAWINGS

Further objects and advantages of the present invention will become apparent to those familiar with the art upon examination of the following detailed description and accompanying drawings in which.

DETAILED DESCRIPTION

The teachings of copending U.S. patent application Ser. No. 160,952, entitled "Local Preservation of Infinite, Uniform Magnetization Field Configuration Under Source Truncation" by the same inventor are hereby incorporated by reference. Furthermore, it should be noted that the magnetic structures disclosed in the present application may be made from any of the aforementioned "hard" magnetic materials. If very high fields are desired, the rare earth permanent magnet materials should be employed.

Figure 1:
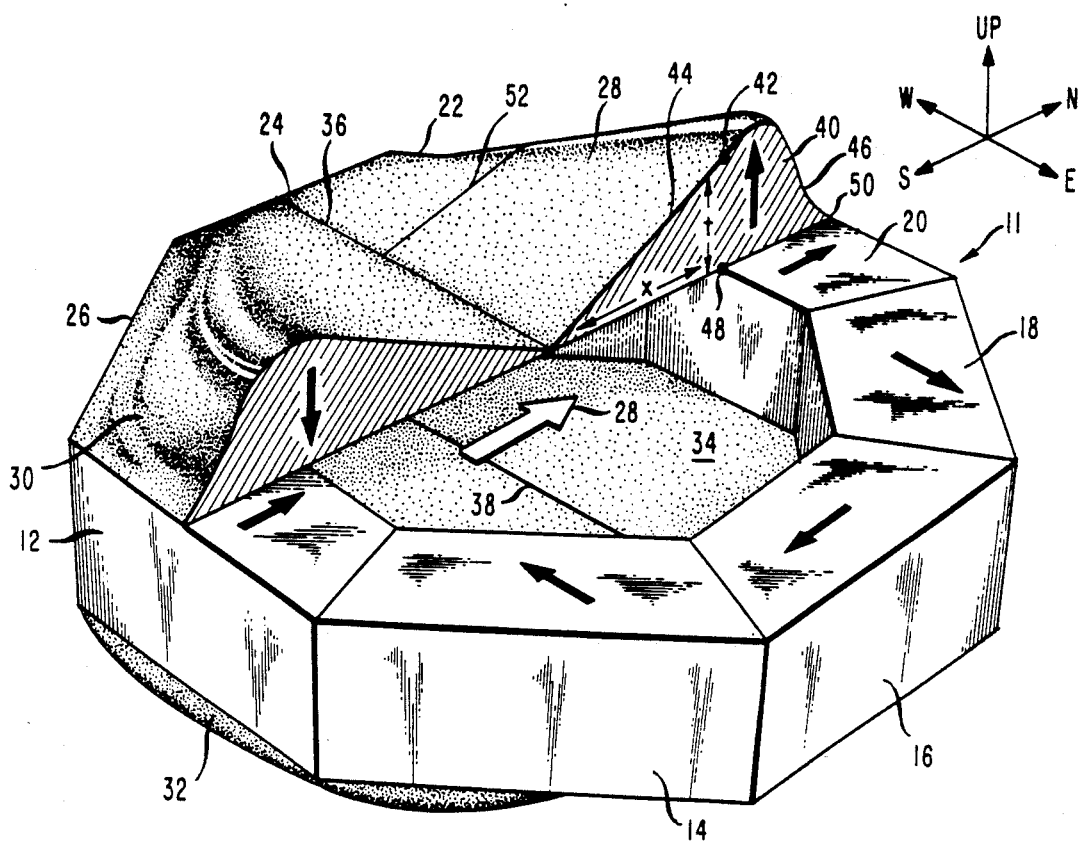
FIG. 1 is a perspective view of a truncated octagonal magic ring with upper and lower cladding magnets according to the present invention.

In FIG. 1, a cladded truncated octagonal magic ring is designated generally by reference numeral 11. Magnet segments 12, 14, 16, 18, 20, 22, 24, and 26 form a truncated octagonal structure which approximates a truncated magic ring. If the magic ring formed by the aforementioned eight segments were infinitely long, the magnetic field designated by arrow 90 in the interior of the magic ring would be precisely uniform within the interior. However, because each of the segments 12-26 has a finite height, there is considerable distortion of the magnetic fields in the interior. However, use of the magic ring in various electronic devices demands that the height of the magic ring be limited.

Each of the magic ring segments 12-26 has a unique magnetic orientation or magnetization, M. For convenience, segments 12 and 20 will be referred to as magnetically oriented in a northerly direction. Thus, in the figure, segments 12 and 20 have arrows pointing in a northerly direction. Segments 16 and 24 are oriented in a southerly direction. Segments 18 and 26 are oriented in an easterly direction, while segments 14 and 22 are oriented in a westerly direction. (The aforementioned compass directions serve merely to provide a convenient frame of reference and should not be confused with magnetic north and south poles).

As mentioned before, since the magic ring is truncated, the field inside the magic ring is not uniform. There is also flux leakage from the interior to exterior of the ring. However, the addition of cladding magnets 28, 30, 32, and 34 to the top and bottom of the magic ring structure will serve to prevent magnetic flux from escaping from the interior of the structure and to create a strong uniform magnetic field in the interior. The following will explain how the shapes of cladding magnetic 28, 30, 32 and 34 are determined.

Lines 36 and 38 are chosen as zero reference for magnetic potential. It should be noted that the plane determined by lines 36 and 38 is perpendicular to the net magnetic field, indicated by arrow 90 within structure 11. (Thus, an equipotential plane has been identified as being perpendicular to a field line - in accord with electrostatic and magnetostatic theory). In theory, lines 36 and 38 indicate where cladding magnets 28-34 have zero height above the magic ring. In practice, lines 36 and 38 indicate the meeting of knife edges (of virtually zero thickness) on magnet pairs 28-30 and 32-24 respectively.

The shape of cladding magnets 28 will now be discussed. The shapes of cladding magnets 30, 32 and 34 are identical to the shape of cladding magnet 28, although their magnetic orientations, M, differ as will be explained further below. Examining cross section 40 of magnet 28, it is seen that the height of magnet 28 increases in a generally linearly fashion from knife edge 36 towards point 42, thence toward an apex, and then decreases along contour line 46. Calculation of the shape of curves 44 and 46 determines the shape of cross sectional area 40.

Calculation of the shape of curves 44 and 46 is performed by requiring that these two curves be lines of zero magnetic potential.

It is assumed that the magnetic field strength, $H_w$, represented by arrow 90 within the working space of the magic ring is known. Design procedures well known to those skilled in the art permit one to calculate the magnetic field strength within the interior of a magic ring when the inner and outer radii of the ring are known, together with the remanence, $B_r$, of the magnetic material comprising the ring. For example, for an ideal, infinitely high magic ring, the magnetic field strength is given by:

$$H_w = B_r L n$$

where
$v_2$ = outer radius of ring
$v_1$ = inner radius of ring
$B_r$ = remanence of ring material Of course, the truncated magic ring illustrated in FIG. 1 has an octagonal cross section and so the above ideal formula does not given an entirely correct result. However, it is a useful approximation.

A more accurate value for H may be obtained by computer simulations well known to those skilled in the art.

The height, t, of any point at an abscissa, x along curves 44 and 46 of FIG. 1 may be calculated from the formula $$S \int_0^x H_w dx = H_c t$$

where $H_c$ = coercivity of cladding magnet material when H is uniform, the above formula reduces to:

$$H_w X = H_c t, \text{ or}$$

$$t = \frac{H_w}{H_c} x$$

It will be noted from an examination of FIG. 1, that the height, t, increases gradually as one proceeds northward from knife edge 36. The height increases until point 42 which is directly above point 48 is reached. Point 48 is the point in which cladding magnet 28 touches magnet segment 20. At point 48, the line integral in equation 2 above changes sign because H, the magnetic field strength within the interior of magnetic segment 20, changes direction and points southward. The H fields in the magnet segment 20 must be obtained to complete the calculation from point 42 northward. The field $H_{mag}$ in the magnet is obtained from:

$$H_{mag} = B_{mag} - B_r$$

where $B_{mag}$ is the flux density in the magnet segment 20 and $B_r$ is the remanence of the segment material.

The height, t, of cladding magnet 28 decreases to zero at point 50 which is the outside edge of magnet segment 20. Cladding magnet 28 need not protrude beyond point 50 because no flux escapes from the interior of the magic ring. The height of many other cross sections of cladding magnets 20, for example, a cross section designated by line 52, may be calculated in the same way. Thus, the shape of the entire exterior contour of magnets 28 may be calculated by successive calculation of cross sections. The procedure is best done via computer. When a sufficient number of cross sections has been calculated, a satisfactory approximation to the ideal exterior contour is obtained.

The orientation of the magnetization of cladding magnets is upward. The magnetic orientation of cladding magnet 30 is downward. The orientation of cladding magnet 32 is upward. And the orientation of cladding magnet 34 is downward. Aforementioned magnets 28, 30, 32 and 34 all have the same shape. Magnets 28 and 32 have the same upward magnetization while magnets 30 and 34 have the same downward magnetization.

Thus, addition of cladding magnets 28, 30, 32 and 34 to the truncated magic ring of FIG. 1 permits achievement of a uniform high strength magnetic field within the interior of a truncated magic ring. The resulting design, resembling a small box or pyx is less bulky and costly than a long cylinder.

The individual cladding magnets 29, 30, 32 and 34 may be individually machined from magnetically "hard" materials and subsequently magnetized. Alternatively, if desired, a series of individual magnets, which taken together have the same external contour as magnets 28, 30, 32 or 34 may be employed.

Thus, what has been described so far is the construction of a small magnetic box or pyx which has an intense, uniform magnetic field within an interior hollow working space. The structure exhibits no or minimal external flux leakage.

Figure 2:
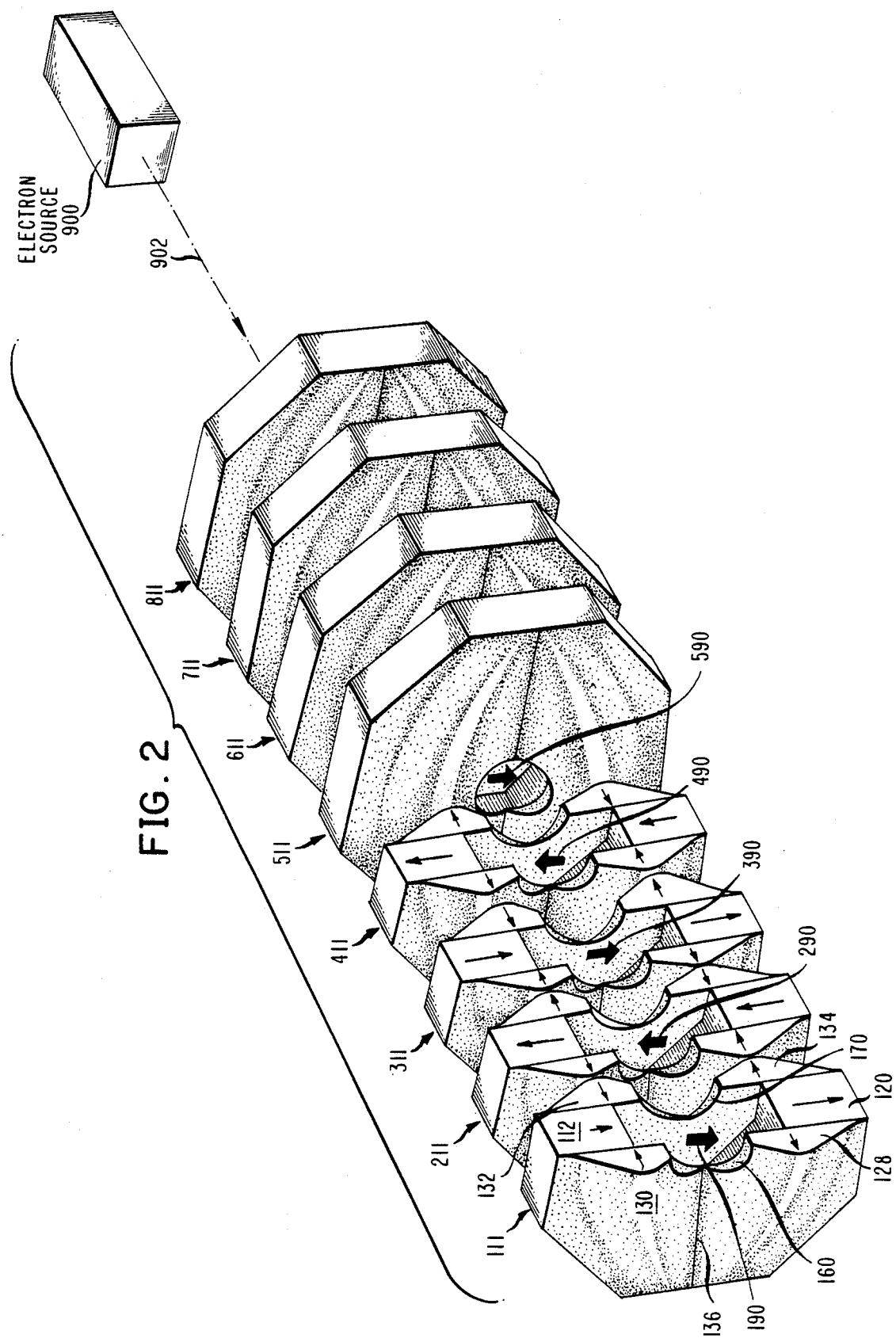
FIG. 2 is a perspective view of a plurality of cladded truncated magic ring structures arranged so that their interior working space fields are 180 apart.

Turning now to FIG. 2, there is shown a linear array of cladded octagonal magic ring pyxes. Each of the pyxes denoted by reference numerals 111, 211, 311, 411, 511, 611, 711 and 811 is similar in shape and construction to the pyx denoted by reference numeral 11 of FIG. 1. However, each of the pyxes 111-811 of FIG. 2 has a small hole in its cladding magnets to permit passage of an electron beam.

Specifically, with reference to pyx 111, it can be seen that magnet segment 112 is similar in shape and construction to magnet segment 12 of FIG. 1. Magnet segment 120 of FIG. 2 is similar in shape and construction to magnet segment 20 of FIG. 1. Cladding magnet 130 of FIG. 2 corresponds to cladding magnet 30 of FIG. 1. Cladding magnet 128 of FIG. 2 corresponds to cladding magnet 28 of FIG. 1. The shapes and orientations of cladding magnets 130 and 128 have already been discussed in connection with FIG. 1. Similarly, cladding magnets 134 and 132 correspond to cladding magnets 34 and 32 of FIG. 1. Hole 160 is formed by drilling or otherwise removing material from cladding magnets 128 and 130. Similarly, hole 170 is formed by removing material from cladding magnets 132 and 134. Thus, holes 160 and 170 permit entry to the interior of pyx 111 and strong uniform magnetic field denoted by reference numeral 190 within the working space of pyx 111.

Pyx 211 is similar to pyx 111. However, pyx 211 is oriented with respect to pyx 111 so that the magnetic field strength denoted by reference numeral 290 within the interior of pyx 211 is 180 opposite to the magnetic field strength denoted by reference numeral 190 of pyx 111. In other words, with regard to FIG. 2, arrow 190 points downward and arrow 290 points upward. Pyxes 311, 411, 511, 611, 711, and 811 are all similar in construction to those just described. However, as can be noted from FIG. 2, the magnetic field vectors within the interiors of each of the pyxes 311-811 alternate in an up-down-up-down sequence. Electron source 900 is positioned so that beam 902 passes through each of the holes in magnetic pyxes 111-811 and is thereby influenced by the strong, alternating magnetic fields within the structure.

Figure 3:
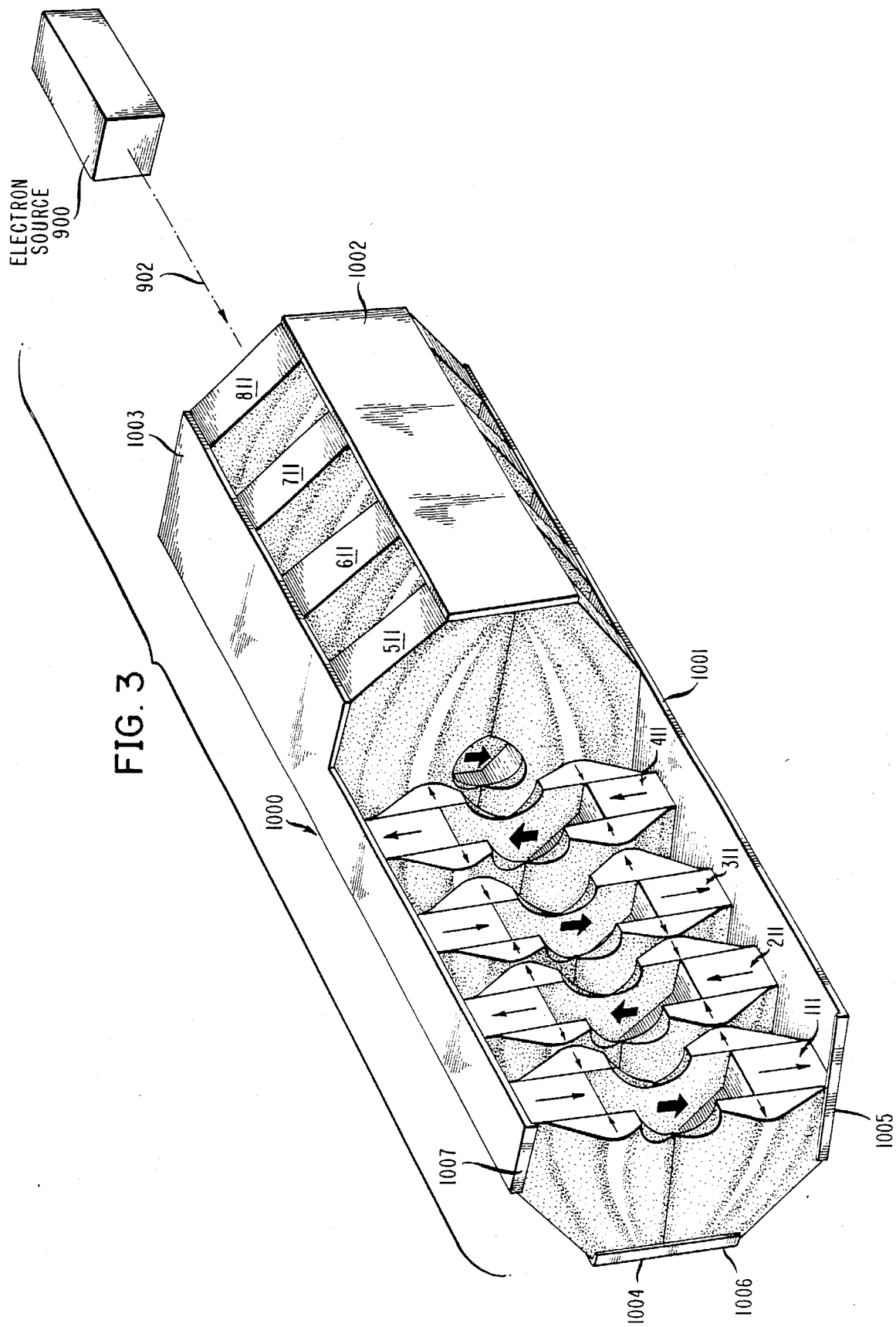
FIGS. 3 and 4 are perspective views of the structure of FIG. 2 together with means for holding the individual truncated magic ring segments together.

FIG. 3 illustrates one method of holding pyxes 111-811 together in a unified structure 1000. Bars 1001, 1002, 1003 and 1004, made from non-ferromagnetic agnetic materials, and having flanges, for example, illustrated by reference numerals 1005, 1006, and 1007 at both ends of structure 1000 contact the octagonal sides of individual pyxes and serve to hold the entire stack together in a unified structure. It should be noted, that since there is little leakage of magnetic flux from the individual pyxes, assembly of the entire structure is relatively easy, i.e. the individual magnetic structures do not "fight" one another. If desired, the interstices between adjacent cladding magnets of structure 1000 may be filled with epoxy. If the epoxy is strong enough, bars 1001, 1002, 1003 and 1004 may be dispensed with entirely.

Figure 4:
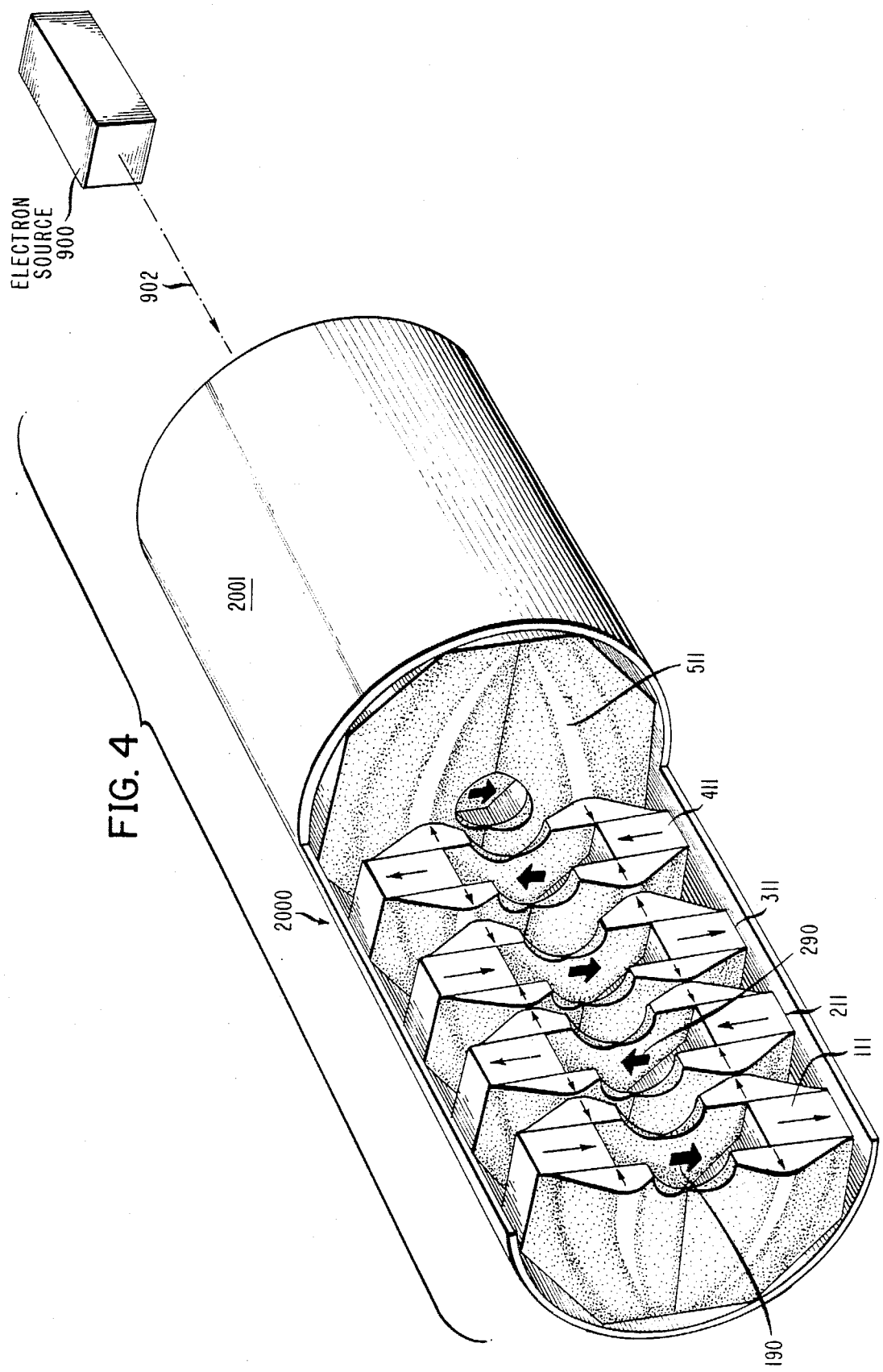

In FIG. 4, another method for holding individual pyxes together is illustrated. Structure 2000 is formed by placing the individual pyxes 111-811 within nonferro magnetic cylinder 2001. It should be noted in FIG. 4, that consistent with FIG. 2, the individual magnetic orientations of successive pyxes are 180 apart. The structure of FIG. 4 provides great flexibility with regard to the relative magnetic orientations of the pyxes 111-811. For example, pyx 211 might be rotated slightly within cylinder 2001 so that the angle between magnetic flux vector 290 and magnetic flux vector 190 of pyx 111 is different than 180, for example, 90 or even 20. Then, pyx 311 might be rotated by the same angular amount relative to pyx 211. Thus, the structure of FIG. 4 makes it possible to control the angular change of the magnetic flux vector from pyx to pyx. A structure in which the angular change in direction of the magnetic flux vector from one pyx to the next pyx is constant (and less than 180) may be used in a twister. Thus, the structure of FIG. 4 is easily adapted to use in a twister.

Of course, clad, truncated magic ring segments with circular cross sections or sixteen-sided cross sections, or thirty-two sided cross sections might also be employed in the present invention. Of course, other components of the wiggler and twister well known to those skilled in the art of design of such devices have been eliminated from the discussion. It should also be borne in mind, that greater or fewer magnetic pyxes may be desirable in any given application.

Accordingly, having and shown and described what is at present considered to be several preferred embodiments of the invention, it should be understood that the same has been shown by way of illustration and not limitation. And all modifications, alterations and changes coming within the spirit and scope of the invention are herein meant to be included.

What is claimed is:

1. A periodic permanent magnet structure comprising:
   a plurality of truncated magic rings arranged in a linear array, each said magic ring having an interior working space and producing a substantially uniform magnetic flux vector therein, a plurality of cladding magnets between each pair of said magic rings, said cladding magnets substantially covering said working spaces and having exterior spaces contoured to substantially prevent the escape of magnetic flux from said working space, said magic rings being arranged so that the angular change in direction of the said magnetic flux vector from one ring to the next ring is constant.

2. The structure of claim 1 further including means for holding said array together.

3. The structure of claim 2 wherein said means for holding said array together is a plurality of brackets spanning the length of said array.

4. The structure of claim 2 wherein said means for holding said array together is epoxy which fills the interstices between adjacent cladding magnets of said array.

5. The structure of claim 2 wherein said means for holding said array together is a cylinder which fits closely around said array.

6. The structure of claim 1 wherein said cladding magnets have holes in registration for admitting an electron beam.

7. The structure of claim 1 wherein said truncated magic rings have octagonal exteriors.

8. The structure of claim 1 wherein said truncated magic rings have sixteen sides.

9. The structure of claim 1 wherein said magic rings and said cladding magnets are made from magnetically hard materials.

10. The structure of claim 1 wherein said magic rings and said cladding magnets are chosen from the group consisting of $Nd_2Fe_{14}B$, $SmCo_5$, $PtCo_5$ and $Sm_2(CoT)_{17}$ where T is chosen from the transition metals.

11. The structure of claim 7 wherein said cladding magnets have a thickness given by the formula $$t = \int_0^x \frac{H_w}{H_c} dx$$

where t = the thickness of the cladding magnet along a given cross section $H_c$ = the coercivity of the cladding magnet material $H_w$ = the magnetic field in said working space x = the abscissa at which thickness t is calculated measured from the closer zero of magnetic potential.

12. The structure of claim 1 wherein all of said cladding magnets have exterior contours which are at the same magnetic potential.

* * * * *